(12) United States Patent
Matsukawa et al.

(10) Patent No.: US 6,878,979 B2
(45) Date of Patent: Apr. 12, 2005

(54) SPIN SWITCH AND MAGNETIC STORAGE ELEMENT USING IT

(75) Inventors: Nozomu Matsukawa, Nara (JP);
Masayoshi Hiramoto, Ikoma (JP);
Akihiro Odagawa, Nara (JP); Mitsuo Satomi, Katano (JP); Yasunari Sugita, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 377 days.

(21) Appl. No.: 10/258,313
(22) PCT Filed: Jan. 18, 2002
(86) PCT No.: PCT/JP02/00328
§ 371 (c)(1),
(2), (4) Date: Oct. 18, 2002
(87) PCT Pub. No.: WO02/058167
PCT Pub. Date: Jul. 25, 2002

(65) Prior Publication Data
US 2003/0142539 A1 Jul. 31, 2003

(30) Foreign Application Priority Data
Jan. 19, 2001 (JP) .......................................... 2001-11245

(51) Int. Cl.[7] ............................................ H01L 31/119
(52) U.S. Cl. ........................ 257/295; 257/421; 257/422; 257/425; 257/613
(58) Field of Search ................................ 257/295, 421, 257/422, 425, 613

(56) References Cited

U.S. PATENT DOCUMENTS

| 5,294,287 | A | * | 3/1994 | Chang et al. | 117/88 |
|---|---|---|---|---|---|
| 5,374,472 | A | * | 12/1994 | Krishnan | 428/216 |
| 5,686,351 | A | * | 11/1997 | Golding et al. | 438/47 |
| 6,218,718 | B1 | * | 4/2001 | Gregg et al. | 257/421 |
| 6,338,899 | B1 | | 1/2002 | Fukuzawa et al. | |
| 6,348,165 | B1 | * | 2/2002 | Akinaga et al. | 252/585 |
| 6,381,171 | B1 | * | 4/2002 | Inomata et al. | 365/173 |
| 6,413,659 | B1 | * | 7/2002 | Rothberg | 428/692 |

FOREIGN PATENT DOCUMENTS

| JP | 9-092903 | 4/1997 |
|---|---|---|
| JP | 10-284765 | 10/1998 |
| JP | 11-087796 | 3/1999 |
| JP | 2000-137906 | 5/2000 |
| JP | 2000-332317 | 11/2000 |

* cited by examiner

*Primary Examiner*—Richard Elms
*Assistant Examiner*—Douglas Menz
(74) *Attorney, Agent, or Firm*—Merchant & Gould P.C.

(57) ABSTRACT

A spin switch that can be driven with voltage. This spin switch includes the following: a ferromagnetic material; a magnetic semiconductor magnetically coupled to the ferromagnetic material; an antiferromagnetic material magnetically coupled to the magnetic semiconductor; and an electrode connected to the magnetic semiconductor via an insulator. A change in the electric potential of the electrode causes the magnetic semiconductor to make a reversible transition between a ferromagnetic state and a paramagnetic state. When the magnetic semiconductor is changed to the ferromagnetic state, the ferromagnetic material is magnetized in a predetermined direction due to the magnetic coupling with the magnetic semiconductor.

13 Claims, 5 Drawing Sheets

SPIN SWITCH AND MAGNETIC STORAGE ELEMENT USING IT

TECHNICAL FIELD

The present invention relates to a spin switch and a magnetic memory device using the same.

BACKGROUND ART

A magnetoresistive element, whose resistance changes with an applied magnetic field, has been developed actively for applications to devices such as a magnetic head and a magnetic random access memory (MRAM) that serves as a magnetic memory device. In particular, the magnetoresistive element including a tunnel junction has attracted considerable attention because of its potentially high MR ratio. Generally, the magnetoresistive element allows information to be written into a memory by changing the magnetization direction of a part of the ferromagnetic materials. The information is read from the memory by detecting a change in electrical resistance caused when the magnetization direction is changed.

The magnetoresistive element has been miniaturized steadily to meet the demand for mass storage or the like. It is expected that the miniaturization will increase a magnetic field required to change the magnetization direction of the ferromagnetic material. However, the magnetic field cannot be sufficiently high by increasing the current, since the conductor wires for generating the magnetic field should be miniaturized as well. Increasing the magnetic field causes crosstalk. The crosstalk causes malfunction of elements that are adjacent to the element to which the magnetic field should be applied. Under these circumstances, there is a limit to the mass storage and high integration of a device using a conventional magnetoresistive element.

Basic research on a material that can be controlled to be paramagnetic or ferromagnetic by application of a voltage has begun (H. Ohno; Nature, Vol. 408, 21/28 December (2000), p. 944). Such a material is called a magnetic semiconductor. The magnetic semiconductor is applied also to a magnetic head (JP 11(1999)-87796 A).

DISCLOSURE OF INVENTION

The use of a magnetic semiconductor has the possibility of achieving a novel magnetic device that can be driven with voltage. However, no one has proposed specifically a spin switch that uses a magnetic semiconductor. Therefore, it is an object of the present invention to provide a spin switch using the magnetic semiconductor and a magnetic memory device including the spin switch.

A first spin switch of the present invention includes the following: a ferromagnetic material; a magnetic semiconductor magnetically coupled to the ferromagnetic material; an antiferromagnetic material magnetically coupled to the magnetic semiconductor; and an electrode connected to the magnetic semiconductor via an insulator. A change in the electric potential of the electrode causes the magnetic semiconductor to make a reversible transition between a ferromagnetic state and a paramagnetic state. In the first spin switch, when the magnetic semiconductor is changed to the ferromagnetic state, the ferromagnetic material is magnetized in a predetermined direction due to the magnetic coupling with the magnetic semiconductor. Here, the magnetic coupling shows that the magnetization directions of two materials have an effect on each other.

A second spin switch of the present invention includes a magnetic semiconductor and at least one electrode that is in contact with the magnetic semiconductor via an insulator and covers at least a portion of the magnetic semiconductor. The magnetic semiconductor includes a magnetization switching region having a longitudinal direction that orients in a predetermined direction (first direction) and a peripheral region next to the magnetization switching region. The total region of the magnetization switching region and the peripheral region has a longitudinal direction that orients in a different direction (second direction) from the predetermined direction. In the second spin switch, a change in the electric potential of the at least one electrode causes the magnetic semiconductor to make a reversible transition between a ferromagnetic state and a paramagnetic state in the portion covered with the at least one electrode. The transition produces a first state in which both the magnetization switching region and the peripheral region are ferromagnetic and a second state in which the magnetization switching region is ferromagnetic, while the peripheral region is paramagnetic. The second spin switch can achieve the magnetization reversal that utilizes a demagnetizing field generated by shape anisotropy. The magnetization switching region is magnetized in its longitudinal direction (first direction) in the first state, and the magnetization direction is changed in the longitudinal direction (second direction) of the total region in the second state.

EMBODIMENTS OF THE INVENTION

The following is an explanation of a first spin switch of the present invention.

Figure 1:
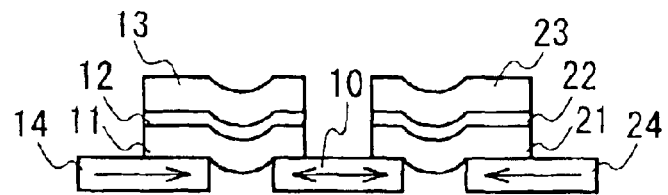
FIG. 1 is a cross-sectional view showing an example of a first spin switch of the present invention.
Figure 2:
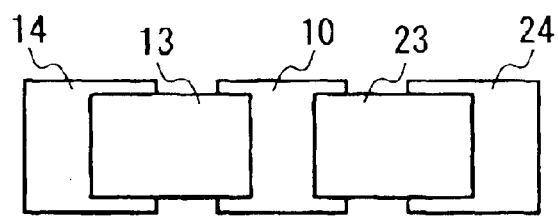
FIG. 2 is a plan view of the spin switch in FIG. 1.

FIGS. 1 and 2 show an embodiment of the first spin switch, in which a ferromagnetic material 10 is in contact with a first magnetic semiconductor 11 and a second magnetic semiconductor 21. The ferromagnetic material is coupled magnetically to each of the first and second magnetic semiconductors by exchange interaction. However, the magnetic coupling is not limited to exchange coupling. For example, a magnetostatic coupling may be employed as long as the coupling is sufficiently strong. The first and second magnetic semiconductors 11, 21 are in contact with a first electrode 13 and a second electrode 23 via insulators 12, 22, respectively. Further, the first and second magnetic semiconductors 11, 21 are in contact with a first antiferromagnetic material 14 and a second antiferromagnetic material 24, respectively. A unidirectional anisotropy is imparted to each of the antiferromagnetic materials so that the unidirectional anisotropies form an angle of 180°, i.e., the anisotropies orient in opposite directions as indicated by the arrows in FIG. 1.

An example of the switching operation of this spin switch will be described below. When the first magnetic semiconductor 11 is changed from paramagnetic to ferromagnetic by application of a voltage from the first electrode 13, the first magnetic semiconductor is magnetized in the same direction as that of the unidirectional anisotropy of the antiferromagnetic material 14 due to the magnetic coupling with this antiferromagnetic material. As a result, the ferromagnetic material 10 also is magnetized in the same direction (first direction) due to the magnetic interaction with the first magnetic semiconductor 11.

Subsequently, when a voltage is not applied to the first electrode 13, but the second electrode 23, the first magnetic semiconductor 11 returns to the paramagnetic state and the second magnetic semiconductor 21 is changed from paramagnetic to ferromagnetic. Thus, the ferromagnetic material 10 is magnetized in the opposite direction (second direction) that is determined by the second antiferromagnetic material 24 via the magnetic couplings between the second antiferromagnetic material 24 and the second magnetic semiconductor 21 and between the second magnetic semiconductor 21 and the ferromagnetic material 10. In this manner, the magnetization of the ferromagnetic material 10 can be reversed by applying a voltage instead of a current. This spin switch can maintain or reverse the magnetization of the ferromagnetic material by injecting holes or electrons into the magnetic semiconductors in accordance with electric potential of the electrodes.

The above operation is only an example. When the amount of dopant is adjusted, the magnetic semiconductor makes a ferromagnetic to paramagnetic transition by application of a voltage. With this operation, the magnetization can be reversed also by stopping the application of a voltage from the electrode.

It is preferable that an angle between the direction of the unidirectional anisotropy of the first antiferromagnetic material 14 and that of the second antiferromagnetic material 24 is in the range of 90° to 180°. As will be described later, when a spin-flip element is used to reverse the unidirectional anisotropy of either of the first and second antiferromagnetic materials, the angle should be in the range of 0° to 90°.

The number of magnetic semiconductors coupled magnetically to the ferromagnetic material is not limited to two, and more than two magnetic semiconductors or only one magnetic semiconductor may be employed.

When only one magnetic semiconductor is used, other means for changing magnetization, e.g., a conductor wire for applying a magnetic field can be added. It is also possible to utilize the shape anisotropy of the ferromagnetic material, which will be described later. In this case, the shape of the ferromagnetic material may be selected so that, e.g., the magnetization direction is changed due to the shape anisotropy when the magnetic semiconductor returns to the paramagnetic state. Alternatively, the device also can be used as a write-once type memory, on which information can be rewritten only once, instead of including the additional means for changing magnetization. In this case, the memory may be initialized with a means for changing magnetization located outside the device.

Figure 3:
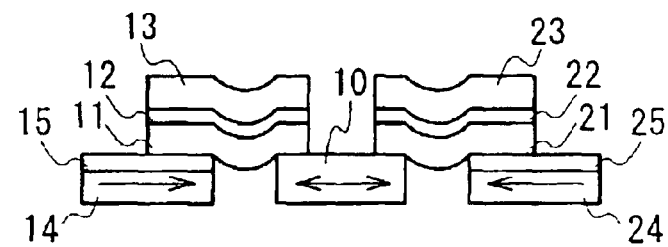
FIG. 3 is a cross-sectional view showing another example of a first spin switch of the present invention.
Figure 4:
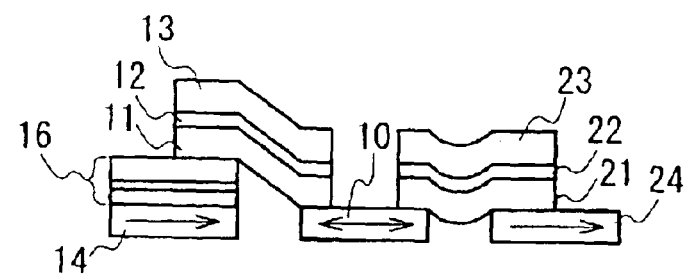
FIG. 4 is a cross-sectional view showing yet another example of a first spin switch of the present invention.
Figure 5:
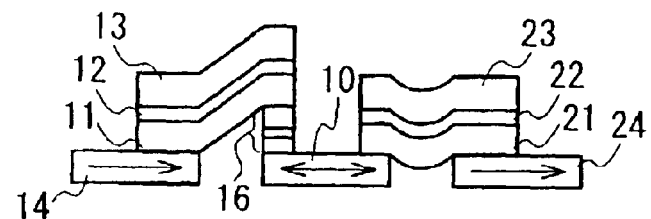
FIG. 5 is a cross-sectional view showing still another example of a first spin switch of the present invention.

As shown in FIGS. 3 to 5, other layers may be interposed between the antiferromagnetic material and the magnetic semiconductor and between the ferromagnetic material and the magnetic semiconductor. These members are not necessarily in contact with each other, as long as they are coupled magnetically.

FIG. 3 shows an element having a configuration in which ferromagnetic materials 15, 25 are interposed between first and second magnetic semiconductors 11, 21 and first and second antiferromagnetic materials 14, 24, respectively.

FIG. 4 shows an element having a configuration in which a laminated ferrimagnetic material 16 is interposed between a first magnetic semiconductor 11 and a first antiferromagnetic material 14 as a spin-flip element. This laminated ferrimagnetic material includes a pair of ferromagnetic materials that sandwich a non-magnetic material, and an exchange coupling is established between the ferromagnetic materials via the non-magnetic material. When the spin-flip element is used, the magnetic semiconductor 11 is magnetized in the opposite direction to the unidirectional anisotropy of the antiferromagnetic material 14. Therefore, the magnetization of a ferromagnetic material 10 can be reversed even if the unidirectional anisotropy of the first antiferromagnetic material 14 is aligned with that of a second antiferromagnetic material 24, as indicated by the arrows in FIG. 4. In the process of producing this type of element, heat treatment in the magnetic field is needed only once to impart unidirectional anisotropy to the antiferromagnetic materials.

FIG. 5 shows an element having a configuration in which a laminated ferrimagnetic material 16 is interposed between a ferromagnetic material 10 and a first magnetic semiconductor 11. Therefore, like the element in FIG. 4, it is only necessary to impart the same unidirectional anisotropy to both antiferromagnetic materials 14, 24. The spin-flip element also may be deposited on the side of a second magnetic semiconductor.

As described above, a preferred embodiment of the present invention includes an element in which the magnetic coupling between the first antiferromagnetic material 14 and the ferromagnetic material 10 or between the second antiferromagnetic material 24 and the ferromagnetic material 10 includes a magnetic coupling that causes magnetization reversal, and the same unidirectional anisotropy is imparted to both the antiferromagnetic materials 14, 24. Specifically, as shown in FIGS. 4 and 5, the spin-flip element can be interposed at at least one position selected from between the ferromagnetic material and the magnetic semiconductor and between the magnetic semiconductor and the antiferromagnetic material. The spin-flip element can be provided at either of the two positions.

When the unidirectional anisotropy should be imparted in opposite directions, the materials used for the first and second antiferromagnetic materials 14, 24 may differ from each other in blocking temperature. A specific example of a method for imparting anisotropy with this preferred embodiment will be described in Examples.

The following is an explanation of a second spin switch of the present invention.

Figure 6:
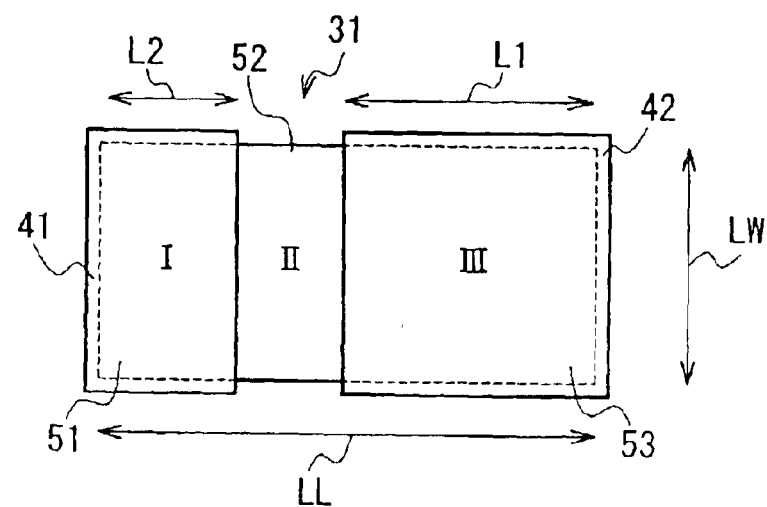
FIG. 6 is a plan view showing an example of a second spin switch of the present invention.

FIG. 6 shows an embodiment of the second spin switch that includes a magnetic semiconductor 31 having long sides LL and short sides LW, a first electrode 41, and a second electrode 42. Each of the first and second electrodes 41, 42 covers a portion of the magnetic semiconductor 31. The magnetic semiconductor 31 is substantially rectangular in plan view, i.e., when observed along the thickness direction. The electrodes 41, 42 are in contact with a first region 51 (represented by I in FIG. 6) and a third region 53 (represented by III in FIG. 6) of the magnetic semiconductor via insulators (not shown), respectively. The first electrode 41 covers a portion of the magnetic semiconductor 31 that extends by a length of L2 from one short side of the magnetic semiconductor in its long side direction. The second electrode 42 covers a portion of the magnetic semiconductor 31 that extends by a length of L1 from the other short side of the magnetic semiconductor in its long side direction. A second region 52 (represented by II in FIG. 6), which serves as a magnetization switching region, is positioned between the first region 51 and the third region 53. Both the first and the third regions 51, 53 correspond to the peripheral regions of the second region 52.

It is preferable that the first, second, and third regions 51, 52, 53 of the magnetic semiconductor 31 are arranged in the order shown in FIG. 6 along the longitudinal direction (second direction) of the total region of the three regions.

It is preferable that LL, LW, L1, and L2 satisfy the following relationships:

a) $L1+L2<LL$;
b) $LL/LW>1$, preferably $LL/LW>1.5$;
c) $LW/\{LL-(L1+L2)\}>1$, preferably $LW/\{LL-(L1+L2)\}>1.5$; and
d) $0.5<LW/(LL-L1)<2$, preferably $0.67<LW/(LL-L1)<1.5$, where L1 and L2 are lengths of the third region and the first region in the longitudinal direction (second direction) of the total region, respectively, LL is a length of the total region in its longitudinal direction (second direction), and LW is a length of the second region in its longitudinal direction (first direction).

An example of the operations of this element will be described by referring to FIGS. 7 to 10. In the following example, the magnetic semiconductor is ferromagnetic in the absence of an applied voltage and changes to be paramagnetic by the application of a voltage. This property is demonstrated in the entire region of the magnetic semiconductor.

Figure 7:
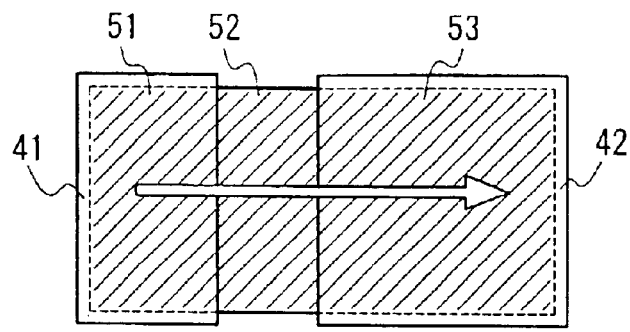
FIG. 7 is a plan view showing the spin switch in FIG. 6 when the total region (a magnetization switching region and its peripheral region) of a magnetic semiconductor is in a ferromagnetic state.
Figure 8:
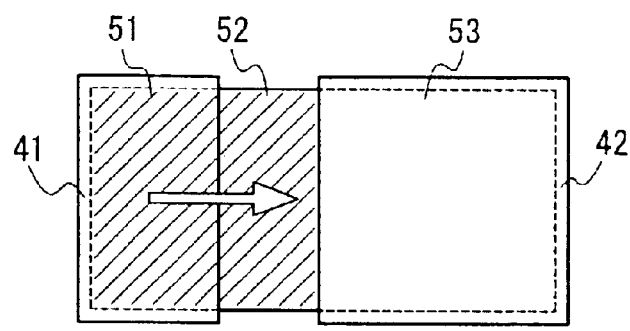
FIG. 8 is a plan view showing the spin switch in FIG. 6 when a portion of the peripheral region of the magnetic semiconductor is changed from the state in FIG. 7 to a paramagnetic state.

When a voltage is not applied to any of the first to third regions, the magnetic semiconductor 31 is ferromagnetic in the entire region, as shown in FIG. 7. In this state, the magnetization orients in the longitudinal direction (second direction) over the entire region due to shape anisotropy. Even if the third region 53 becomes paramagnetic by applying a voltage to the second electrode 42, the magnetization direction in the first and second ferromagnetic regions 51, 52 can be maintained, as shown in FIG. 8.

Figure 9:
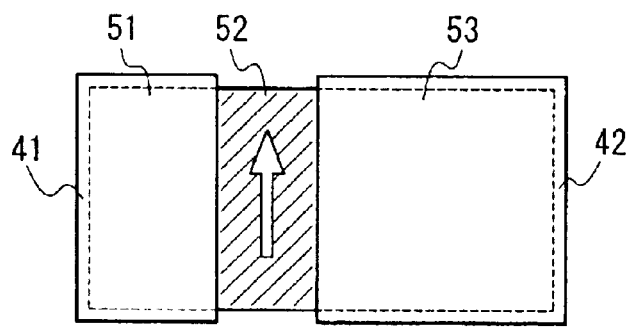
FIG. 9 is a plan view showing the spin switch in FIG. 6 when the remaining portion of the peripheral region of the magnetic semiconductor is changed further from the state in FIG. 8 to the paramagnetic state.
Figure 10:
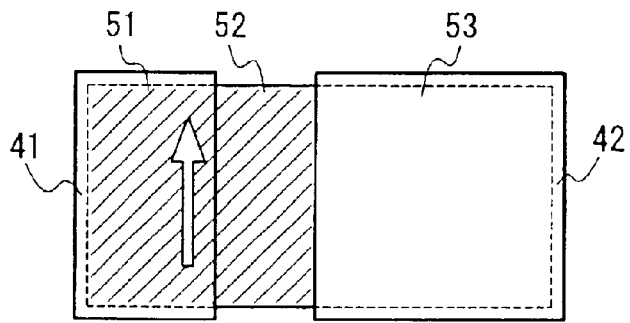
FIG. 10 is a plan view showing the spin switch in FIG. 6 when a portion of the peripheral region of the magnetic semiconductor is changed from the state in FIG. 9 to the ferromagnetic state.

However, when a voltage is applied further to the first electrode 41 so that the first region 51 becomes paramagnetic, the ferromagnetic region is limited only to the second region 52, as shown in FIG. 9. In this state, the second region is magnetized in its longitudinal direction (first direction) due to shape anisotropy. Consequently, the magnetization direction is changed by about 90° in the second region. When the application of a voltage from the first electrode 41 is ended while maintaining the magnetized state of the second region, such a change in magnetization direction expands to the first region 51, as shown in FIG. 10. Thus, the above operations change the magnetization direction in the first and second regions 51, 52.

In this example of the operations, the first and second regions 51, 52 can be used as a memory region. As given by the formula d), it is preferable that the memory region has a shape that is little affected by the shape anisotropy.

Moreover, when the application of a voltage from the second electrode 42 is released in the state illustrated in FIG. 10, the entire region of the magnetic semiconductor 31 is magnetized in the second direction again under the influence of shape anisotropy, as shown in FIG. 7.

In this manner, the magnetization can be reversed by applying a voltage instead of a current. This spin switch also can maintain or reverse the magnetization of the ferromagnetic material by injecting holes or electrons into the magnetic semiconductor.

Figure 11:
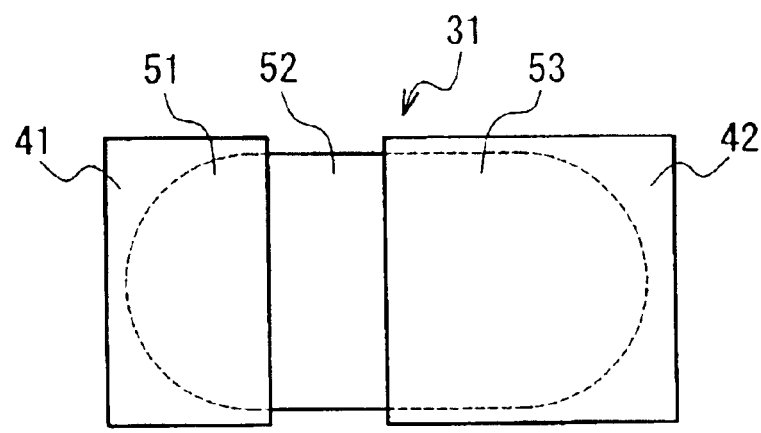
FIG. 11 is a plan view showing another example of a second spin switch of the present invention.

The shape of the magnetic semiconductor is not particularly limited, as long as the magnetization reversal is caused by shape anisotropy. For example, it may have a substantially elliptical shape in plan view, as shown in FIG. 11. There also is no particular limitation to the arrangement of the electrodes, and the magnetic semiconductor is not always covered with the electrodes at the end portions. It is preferable that the electrodes are not arranged in the magnetization switching region, but in the peripheral region.

This spin switch also can perform different switching operations by adjusting the amount of dopant in each of the regions so as to change the characteristics of the magnetic semiconductor. To achieve preferred dopant adjustment, e.g., the amount of dopant is changed slightly so that the first and second regions 51, 52 are ferromagnetic and the third region 53 is paramagnetic in the absence of an applied voltage. This adjustment can eliminate the application of a voltage to maintain the magnetization (FIGS. 8 and 10).

Figure 12:
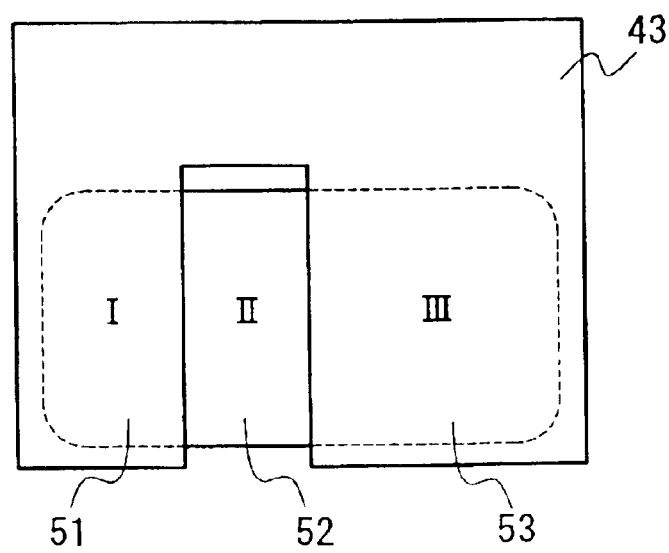
FIG. 12 is a plan view showing yet another example of a second spin switch of the present invention.

When the amount of dopant is adjusted as described above, the same operation can be performed even if the first and second electrodes are short-circuited to form a single electrode 43, as shown in FIG. 12. This operation depends on the characteristics of the magnetic semiconductor.

For a magnetic semiconductor whose Tc (Curie temperature) changes with hole density, the injection of holes into the magnetic semiconductor in its ferromagnetic state further increases Tc, while maintaining the ferromagnetic state. Similarly, for a magnetic semiconductor whose Tc changes with electron density, the injection of electrons into the magnetic semiconductor in its ferromagnetic state further increases Tc, while maintaining the ferromagnetic state. Therefore, when the magnetic semiconductor that is adjusted to include the amount of dopant as described above and the electrode shown in FIG. 12 are used together, the magnetization in the first to third regions can orient in the longer side direction (FIG. 7), e.g., by applying a positive voltage from the electrode 43, and the magnetization in the second region can orient in the shorter side direction (FIG. 9), e.g., by applying a negative voltage. In the absence of an applied voltage, the magnetization can be maintained (FIGS. 8 and 10).

The spin switch of the present invention can be applied, e.g., to a magnetic memory device. An example of the magnetic memory device will be described below. However, the magnetic memory device of the present invention is not limited by the following configuration.

Figure 13:
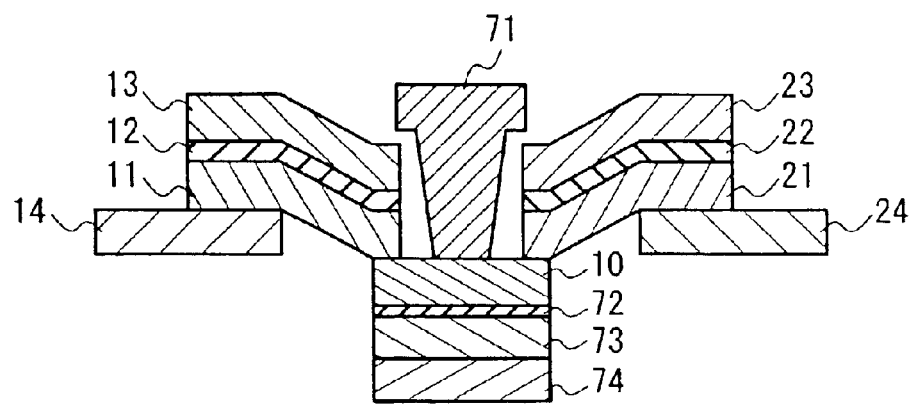
FIG. 13 is a cross-sectional view showing an example of a magnetic memory device of the present invention that includes a first spin switch.

FIG. 13 shows a magnetic memory device that includes the first spin switch of the present invention and an upper electrode 71 connected to a ferromagnetic material 10 whose magnetization direction is changed by a switching operation. This magnetic memory device includes a magnetoresistive element that uses the ferromagnetic material 10 as a free magnetic layer. The magnetoresistive element has a multi-layer structure of free magnetic layer (ferromagnetic material) 10/high-resistance layer 72/pinned magnetic layer (ferromagnetic material) 73/antiferromangnetic material 74. The high-resistance layer 72 is, e.g., a tunnel insulating layer. In the magnetoresistive element, current flows between a lower electrode (not shown) and the upper electrode 71 to detect a change in resistance caused when the magnetization direction of the ferromagnetic material 10 is changed.

Figure 14:
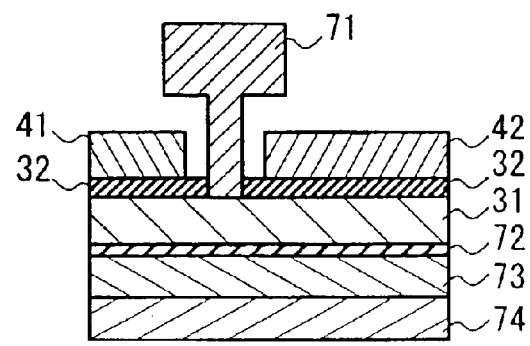
FIG. 14 is a cross-sectional view showing an example of a magnetic memory device of the present invention that includes a second spin switch.

FIG. 14 shows another example of a magnetic memory device of the present invention. This device includes the second spin switch of the present invention. In the device, an upper electrode 71 is connected to a magnetization switching region (second region) of a magnetic semiconductor 31 whose magnetization direction is changed by a switching operation. This magnetic memory device also includes the same magnetoresistive element as that described above, which uses the ferromagnetic material as a free magnetic layer. A change in resistance caused by a difference between the magnetization directions can be detected with a lower electrode (not shown) and the upper electrode 71.

There is no particular limitation to the materials for the magnetic semiconductor, and suitable materials are expressed by $(L_{1-x}M_x)Q$ or $(R_{1-x}M_x)(T_{1-y}Q_y)$, where L is at least one element selected from B, Al, Ga, In and Tl, particularly selected from Al, Ga and In; M is at least one element selected from V, Cr, Mn, Fe, Co and Ni, particularly Mn; and Q is at least one element selected from N, P, As, Sb and Bi, particularly selected from N, P, As and Sb.

R is at least one element selected from Zn, Cd and Hg; M is the same as that described above; T is at least one element selected from O, S, Se, Te and Po, particularly selected from O, S, Se and Te; and Q is the same as that described above.

L, M, Q, R and T may be composed of two or more elements. Examples of M include NiFe, CoFe, FeCr and MnFe. Examples of R include ZnCd and ZnHg.

Here, x is a value in the range of 0.001 to 0.3, and y is a value in the range of 0 to 0.3.

In the above magnetic semiconductors, x can be varied to adjust the amount of dopant, thereby changing the characteristics. There are two types of doping amount that determines Tc of the magnetic semiconductor: the doping amount of spin defined by the elements having spins as represented by M; and the doping amount of carrier similar to that of a general semiconductor. For example, when L=Ga, M=Mn and Q=As, Mn is doped with both spins and holes. The doping amount of spin can be controlled basically with the addition of magnetic elements represented by M. The doping amount of carrier can be controlled by varying x and y. Moreover, it also can be controlled in such a manner that the ratio of $(L_{1-x}M_x)$ to Q or the ratio of $(R_{1-x}M_x)$ to $(T_{1-y}Q_y)$ is shifted slightly from 1:1, i.e., a lattice defect is introduced to the magnetic semiconductor. The characteristics of the magnetic semiconductor can be controlled by controlling the composition and additional elements described above.

For other members, such as the ferromagnetic material, the antiferromagnetic material, and the non-magnetic material (high-resistance film), conventionally known materials can be used without any limitations.

A magnetic memory device of the present invention can be produced by forming a multi-layer film on a substrate. As the substrate, a material with an insulated surface, e.g., a Si substrate obtained by thermal oxidation, a quartz substrate, and a sapphire substrate can be used. To smooth the substrate surface, a smoothing process, e.g., chemomechanical polishing (CMP) may be performed as needed. A substrate provided with a switching element such as a MOS transistor also can be used.

The multi-layer film can be formed with a general thin film producing method, e.g., sputtering, molecular beam epitaxy (MBE), chemical vapor deposition (CVD), pulse laser deposition, and ion beam sputtering. As a micro-processing method, well-known micro-processing methods, such as photolithography using a contact mask or stepper, electron beam (EB) lithography and focused ion beam (FIB) processing, may be employed.

For etching, e.g., ion milling and reactive ion etching (RIE) may be employed. CMP or precision lapping can be used to smooth the surface and to remove a portion of the film.

If necessary, the multi-layer film may be heat-treated in vacuum, inert gas, or hydrogen, with or without application of a voltage.

EXAMPLES

Example 1

A magnetic memory device with the configuration shown in FIG. 13 was produced. In this example, the following materials were used to form each member: PtMn for antiferromagnetic materials 14, 74; IrMn for an antiferromagnetic material 24; AlOx ($x \leq 1.5$) having a thickness of 1.2 nm for a high-resistance film (tunnel insulating layer) 72; $Co_{75}Fe_{25}$ having a thickness of 3 nm for ferromagnetic materials 10, 73; $(In_{0.97}Mn_{0.03})As$ having a thickness of 1.5 nm for magnetic semiconductors 11, 21; $Ta_2O_5$ having a thickness of 7 nm for insulators 12, 22; TiN(3 nm)/Pt for electrodes 13, 23; and Ta(3 nm)/Cu for an upper electrode 71.

When no voltage was applied, Tc of $(In_{0.97}Mn_{0.03})As$ was about 30 K. Therefore, the magnetic semiconductor was paramagnetic at temperatures slightly greater than 30 K in the absence of an applied voltage. By injecting holes with voltage, the magnetic semiconductor became ferromagnetic in that temperature range. On the other hand, the magnetic semiconductor was ferromagnetic at temperatures slightly less than 30 K in the absence of an applied voltage. By injecting electrons with voltage to compensate for hole carriers, the magnetic semiconductor became paramagnetic.

The magnetic semiconductor was formed with MBE, and other films were formed with appropriate methods such as sputtering. The tunnel insulating layer was produced by oxidizing an Al metal film. Each member was formed to have a predetermined shape by photolithography or the like. A lower electrode made of Cu was located below the antiferromagnetic materials, though it was not shown in FIG. 13. The members were insulated from each other with $SiO_2$, which also was not shown in the drawing.

Different unidirectional anisotropies were imparted to the two antiferromagnetic materials 14, 24, which constitute the spin switch, by utilizing a difference in blocking temperature between PtMn and IrMn. First, heat treatment at 300° C. was performed for 5 hours while applying a magnetic field of 5 kOe (398 kA/m) in a predetermined direction, and then another heat treatment at 250° C. was performed for 1 hour while applying a magnetic field of 500 Oe in the opposite direction to the predetermined direction, followed by cooling with this magnetic field maintained. PtMn had a blocking temperature of 380° C., and the device was designed so as to generate an exchange coupling magnetic field of about 1 kOe. Therefore, under the conditions of 500 Oe and 250° C., the direction of the unidirectional anisotropy of PtMn was unchanged, and only the direction of the unidirectional anisotropy of IrMn was changed.

In the magnetic memory device thus produced, when a voltage was applied from the electrodes 13, 23 according to the switching operation described above, the magnetization of the ferromagnetic material 10 was changed. Moreover, the magnetoresistance effect resulting from this change was measured as well.

The preferred combination of the antiferromagnetic materials for the two-stage heat treatment in the magnetic field is described below. A first material is at least one selected from PtMn, NiMn, PdPtMn and CrMnPt. A second material to be combined with the first material is at least one selected from IrMn, FeMn, CrAl, NiO and $\alpha Fe_2O_3$. When a combination of these materials is used for the first and second antiferromagnetic materials 14, 24 and the above method is employed, the first and second antiferromagnetic materials having unidirectional anisotropies that orient in opposite directions can be obtained. This method includes two steps of heat treatment in the order described in the following. The first step performs heat treatment at temperatures higher than the blocking temperature of the first material while applying a magnetic field in a first direction. The second step performs heat treatment at temperatures ranging from the blocking temperature of the second material to that of the first material while applying a magnetic field in a second direction that preferably makes an angle of 90° to 180° with the first direction.

Using this method, the characteristics of the device were measured while changing the angle between the unidirectional anisotropies of the first and second antiferromagnetic materials. The result showed that a S/N ratio for reading increased as the angle was close to 180°, and a substantially practical S/N ratio was obtained when the angle was 90° or more.

Example 2

A device shown in FIG. 14 was produced by using the same materials as those in Example 1. However, the thickness of a magnetic semiconductor 31 was 3 nm and that of an insulator 32 was 10 nm. The magnetic semiconductor of this device had the same shape as that in FIG. 6. Referring to FIG. 6, the device shape was represented as follows:

LL=1.8 µm, LW=0.9 µm, L1=0.9 µm, and L2=0.5 µm.

In the magnetic memory device thus produced, when a voltage was applied from electrodes 41, 42 according to the switching operation described above, the magnetization of the magnetic semiconductor 31 was changed in the region including a magnetization switching region to which an electrode was connected. Moreover, the magnetoresistance effect resulting from this change was measured as well.

In Examples 1 and 2, other devices were produced by appropriately changing the materials used for each member. Consequently, it was confirmed that well-known materials could be used in a device of the present invention. Example of the material for a high-resistance layer (tunnel insulating layer) 72 include AlOx, TaOx, BN, C and AlN, each having a thickness of about 0.8 to 2 nm. Examples of the material for a pinned magnetic layer 73 include $Co_{90}Fe_{10}$, $Co_{50}Fe_{50}$, $Ni_{80}Fe_{20}$, $Ni_{60}Fe_{40}$, $Ni_{40}Fe_{60}$, Co and Fe. The same effect was obtained even if $Co_{75}Fe_{25}$, $Ni_{60}Fe_{40}$, or the like was provided at the interface between the pinned magnetic layer and the high-resistance layer.

The device also operated by using a laminated ferrimagnetic material as the pinned magnetic layer. Films having a trilayer structure represented by $Co_{75}Fe_{25}$/Ru (a thickness of about 0.7 nm)/$Co_{75}Fe_{25}$ or $Co_{90}Fe_{10}$/Ru (a thickness of about 0.7 nm)/$Co_{90}Fe_{10}$ were effective for the laminated ferrimagnetic material.

It was possible to form a ferromagnetic material 10 that served as a free magnetic layer with the same materials as the pinned magnetic layer 73. "Soft" magnetic materials, such as $Co_{90}Fe_{10}$ and $Ni_{80}Fe_{20}$, were suitable for the free magnetic layer. However, the laminated ferrimagnetic material is unsuitable for the free magnetic layer of the second spin switch of the present invention in Example 2. Since the second spin switch utilizes a demagnetizing field as energy for changing the magnetization, it is not preferable to use the laminated ferrimagnetic material that is responsible for reducing the demagnetizing field. In the first spin switch, when the device size decreases below 1 µm, the demagnetizing field causes a rise in energy for magnetization reversal. Therefore, in contrast to the second spin switch, the laminated ferrimagnetic material represented, e.g., by $Ni_{60}Fe_{40}$/Ir (a thickness of about 0.5 nm)/$Ni_{60}Fe_{40}$ may be used as the free magnetic layer to suppress an increase in magnetization reversal energy.

Each example employs the magnetic semiconductor that satisfies the equations described above. When the magnetic semiconductor satisfies each of the above equations for x=0.01, 0.2 or 0.25 and y=0, 0.1 or 0.25, it can provide the same effect qualitatively.

What is claimed is:

1. A spin switch comprising:
 a ferromagnetic material;
 a magnetic semiconductor magnetically coupled to the ferromagnetic material;
 an antiferromagnetic material magnetically coupled to the magnetic semiconductor; and
 an electrode connected to the magnetic semiconductor via an insulator,
 wherein a change in electric potential of the electrode causes the magnetic semiconductor to make a reversible transition between a ferromagnetic state and a paramagnetic state, and
 wherein when the magnetic semiconductor is changed to the ferromagnetic state, the ferromagnetic material is magnetized in a predetermined direction due to the magnetic coupling with the magnetic semiconductor.

2. The spin switch according to claim 1, further comprising:
 a second magnetic semiconductor;
 a second antiferromagnetic material; and
 a second electrode,
 wherein the magnetic semiconductor, the antiferromagnetic material, and the electrode are identified by a first magnetic semiconductor, a first antiferromagnetic material, and a first electrode,
 wherein the ferromagnetic material is coupled magnetically to the second magnetic semiconductor, the second magnetic semiconductor is coupled magnetically to the second antiferromagnetic material, and the second magnetic semiconductor is connected to the second electrode via an insulator, wherein a change in electrical potential of the second electrode causes the second magnetic semiconductor to make a reversible transition between a ferromagnetic state and a paramagnetic state, and wherein when the second magnetic semiconductor is changed to the ferromagnetic state, the ferromagnetic material is magnetized in a second direction due to the magnetic coupling with the second magnetic semiconductor, where the predetermined direction is identified by a first direction.

3. The spin switch according to claim 2, wherein each of the first antiferromagnetic material and the second antiferromagnetic material has a unidirectional anisotropy, and an angle between directions of the unidirectional anisotropies is in the range of 90° to 180°.

4. The spin switch according to claim 3, wherein a material for the first antiferromagnetic material and a material for the second antiferromagnetic material differ from each other in blocking temperature.

5. The spin switch according to claim 1, wherein a ferromagnetic material is interposed between the magnetic semiconductor and the antiferromagnetic material.

6. The spin switch according to claim 1, wherein a spin-flip element is interposed at at least one position selected from between the ferromagnetic material and the magnetic semiconductor and between the magnetic semiconductor and the antiferromagnetic material.

7. A magnetic memory device comprising:

a spin switch according to claim 1, wherein a change in magnetization direction of the ferromagnetic material is detected as a change in resistance.

8. A spin switch comprising:

a magnetic semiconductor; and at least one electrode that is in contact with the magnetic semiconductor via an insulator and covers at least a portion of the magnetic semiconductor, wherein the magnetic semiconductor comprises a magnetization switching region having a longitudinal direction that orients in a first direction and a peripheral region next to the magnetization switching region, and a total region of the magnetization switching region and the peripheral region has a longitudinal direction that orients in a second direction different from the first direction, wherein a change in electric potential of the at least one electrode causes the magnetic semiconductor to make a reversible transition between a ferromagnetic state and a paramagnetic state in the portion covered with the at least one electrode, and wherein the transition produces a first state in which both the magnetization switching region and the peripheral region are ferromagnetic and a second state in which the magnetization switching region is ferromagnetic, while the peripheral region is paramagnetic.

9. The spin switch according to claim 8, wherein the magnetic semiconductor comprises a first region and a third region as the peripheral region, and a second region as the magnetization switching region, and wherein the first region, the second region, and the third region are arranged in this order along the second direction.

10. The spin switch according to claim 9, satisfying the following relationships:

L1+L2<LL;

LL/LW>1;

LW/{LL−(L1+L2)}>1; and 0.5<LW/(LL−L1)>2, where L1 and L2 are lengths of the third region and the first region in the second direction, respectively, LL is a length of the total region in the second direction, and LW is a length of the second region in the first direction.

11. The spin switch according to claim 10, wherein the magnetic semiconductor is ferromagnetic when no voltage is applied from the electrode.

12. The spin switch according to claim 10, wherein the magnetic semiconductor is ferromagnetic in the first and second regions and is paramagnetic in the third region when no voltage is applied from the electrode.

13. A magnetic memory device comprising:

a spin switch according to claim 8, wherein a change in magnetization direction of the magnetic semiconductor is detected as a change in resistance.

* * * * *